(12) United States Patent
Kuo (10) Patent No.: US 7,561,641 B2
(45) Date of Patent: Jul. 14, 2009

(54) METHOD OF VITERBI DECODING WITH REDUCED BUTTERFLY OPERATION

(75) Inventor: Tsung-Sheng Kuo, Taipei (TW)

(73) Assignee: Tatung Company, Taipei (TW)

( * ) Notice: Subject to any disclaimer, the term of this patent is extended or adjusted under 35 U.S.C. 154(b) by 615 days.

(21) Appl. No.: 11/347,175

(22) Filed: Feb. 6, 2006

(65) Prior Publication Data

US 2007/0183538 A1    Aug. 9, 2007

(51) Int. Cl.
*H04L 27/06* (2006.01)
(52) U.S. Cl. ..................................... 375/341
(58) Field of Classification Search ............... 375/340, 375/341, 260, 261; 714/786, 791, 792, 794, 714/795, 796
See application file for complete search history.

(56) References Cited

U.S. PATENT DOCUMENTS 6,163,581 A * 12/2000 Kang ........................ 375/341
6,772,183 B1 * 8/2004 Bekooij et al. ............. 708/403
6,810,095 B2 * 10/2004 Naitou ....................... 375/341
2007/0036244 A1 * 2/2007 Sonu ......................... 375/340

OTHER PUBLICATIONS

Peter J. Black and Teresa H. Meng, "A 140-Mb/s, 32-State, Radix-4 Viterbi Decoder," IEEE Journal of Solid-State Circuities, vol. 27, No. 12, Dec. 1992, pp. 1877-1885.*

* cited by examiner

*Primary Examiner*—Chieh M Fan
*Assistant Examiner*—Jaison Joseph
(74) *Attorney, Agent, or Firm*—Bacon & Thomas, PLLC (57) ABSTRACT

A method of Virterbi decoding with a reduced butterfly operation decodes an encoded signal to reconstruct a source data signal. The method comprising the steps of: (A) receiving the encoded signal; (B) computing kernel branch metrics with the reduced butterfly operation in accordance with the encoded signal; (C) using symmetry property of the reduced butterfly operation to obtain branch metrics other than the kernel branch metrics; (D) computing path metrics for each node; (E) selecting a surviving path with the smallest path metric for each nodes.

5 Claims, 6 Drawing Sheets

METHOD OF VITERBI DECODING WITH REDUCED BUTTERFLY OPERATION

BACKGROUND OF THE INVENTION

1. Field of the Invention

The invention relates to the technical field of Viterbi decoding and, more particularly, to a method of Viterbi decoding with reduced butterfly operation.

2. Description of Related Art

Currently, in communication systems, the convolutional codes are widely used to increase the reliability of transmission due to their high error-correcting capability. In contrast to the block codes, the convolutional codes contain a high error-correcting capability by increasing their constraint length rather than increasing the code redundancy, and therefore require less transmission bandwidth to compensate the redundancy.

The Viterbi decoding method is the most popular decoding scheme of the convolutional codes. It finds the sequence of branch words closest in distance to the received noisy sequence in a trellis diagram. To find the closest sequence, the branch metric for each branch in the trellis diagram needs to be computed. A code with rate k/n and constraint length v has $2^{k+v}$ branches at each decoding stage. Hence, the computational complexity of the Viterbi decoding method increases exponentially with constraint length v.

For rate 1/n convolutional codes, a butterfly operation has been used to simplify the implementation of the Viterbi decoding method by exploiting the symmetry of trellis branches. The butterfly contains a pair of origin and destination states, and four branches. Since the branch word in the butterfly is either the same or complement to the other, only one branch metric needs to be computed. Hence the branch metric computation can be reduced by a factor of 4. Unfortunately, the butterfly operation only works for rate 1/n convolutional codes.

Figure 1:
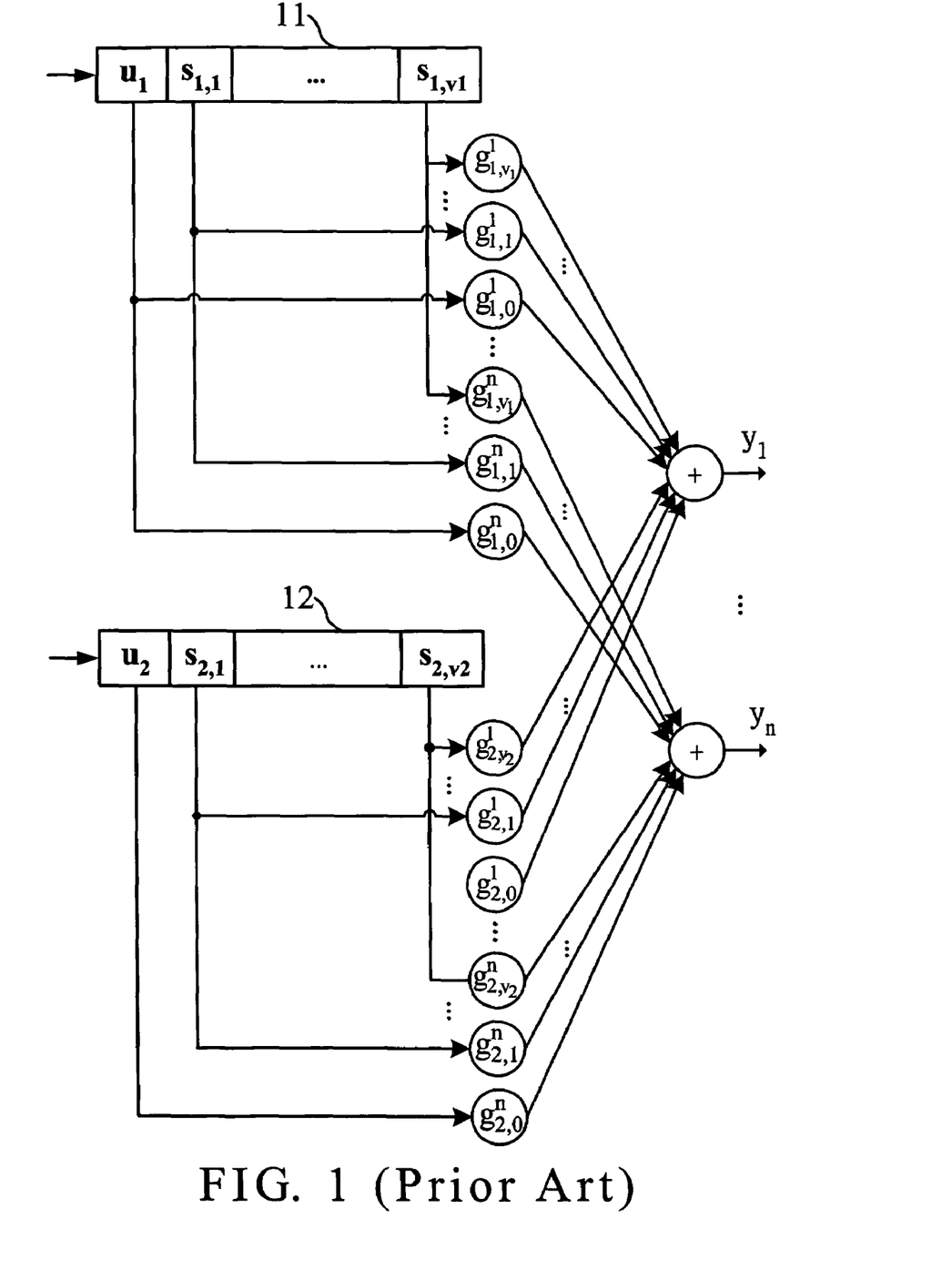
FIG. 1 is a schematic view of a conventional 2/n convolutional encoder.

A conventional 2/n convolutional encoder is shown in FIG. 1. As shown in FIG. 1, the encoder has two shift registers 11 and 12 with lengths $v_1+1$ and $v_2+1$ respectively, and its overall constraint length is defined as $v=v_1+v_2$. Two input bits $u_1$ and $u_2$ are shifted at a time and n output bits from the n adders yield the output word $y_1 y_2 \ldots y_n$. The generator sequence of the i-th output bit $y_i$ with respect to the j-th input bit $u_j$ is denoted as $g_j^i = [g_{j,0}^i, g_{j,1}^i, \ldots, g_{j,v^j}^i]$ where $i=1, \ldots, n$ and $j=1, 2$. The output bit $y_i$ can be written as the following equation (1):

$$y_i = g_{1,0}^i \cdot u_1 \oplus g_{1,1}^i \cdot s_{1,1} \oplus \cdots \oplus g_{1,v_1}^i \cdot s_{1,v_1} \oplus \\ g_{2,0}^i \cdot u_2 \oplus g_{2,1}^i \cdot s_{2,1} \oplus \cdots \oplus g_{2,v_2}^i \cdot s_{2,v_2}, \quad (1)$$

where $\oplus$ denotes the modulo-2 adder.

The trellis diagram is an alternative method of describing a convolutional code. In the trellis representation of a convolutional code, the state S is defined as the shift register content except input bits ($u_1$, $u_2$), and has a binary v-tuple form as shown in the following equation (2):

$$S = (s_{1,1} s_{1,2} \ldots s_{1,v_1} s_{2,1} s_{2,2} \ldots s_{2,v_2}) \quad (2)$$

Figure 2:
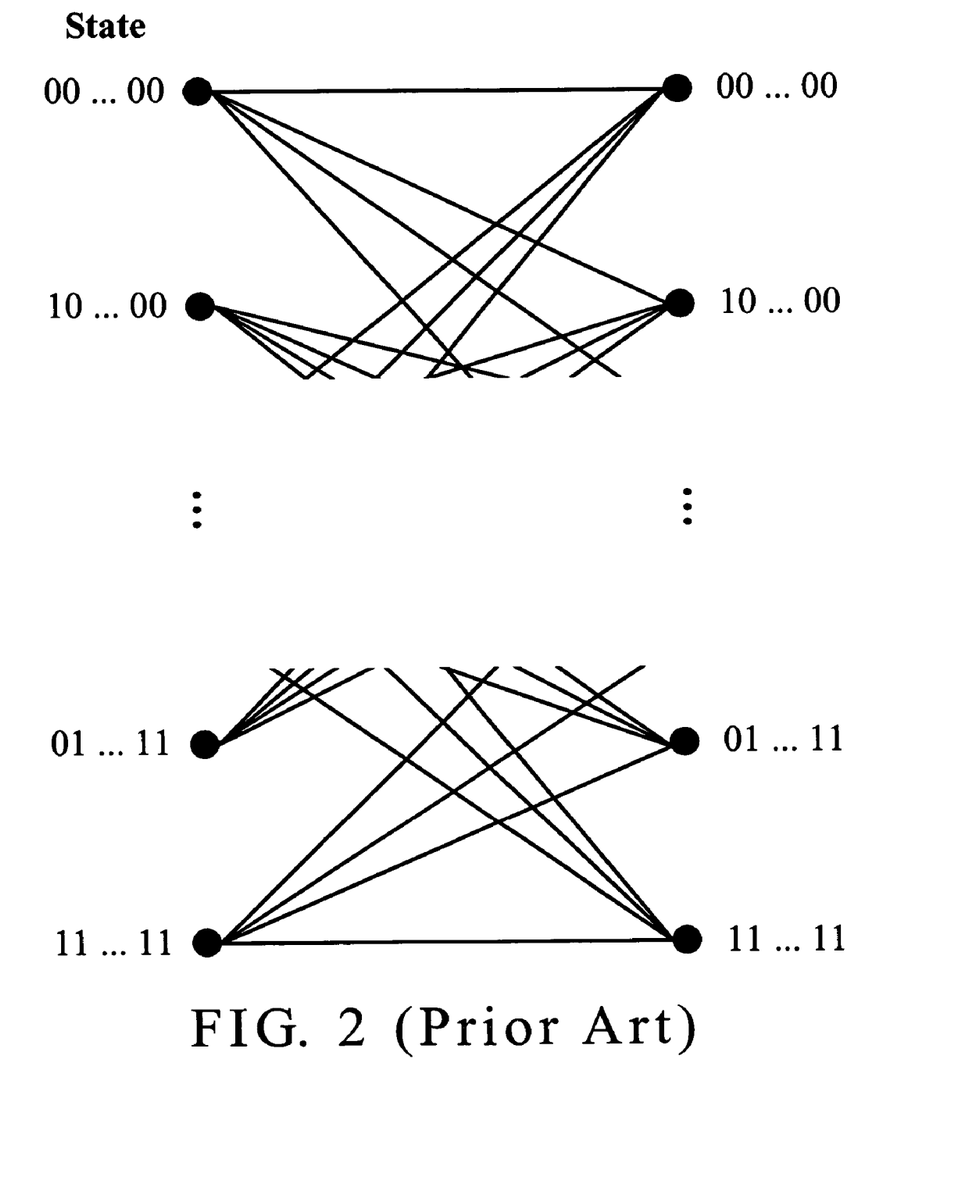
FIG. 2 is a schematic view of a trellis of a rate 2/n convolutional code with $2^v$ state nodes.

FIG. 2 shows a schematic view of the trellis of a rate 2/n convolutional code with $2^v$ state nodes. The input bits $u_1 u_2$ cause the state node S to make a state transition from the origin state node($s_{1,1} s_{1,2} \ldots s_{1,v_1} s_{2,1} s_{2,2} \ldots s_{2,v_2}$) to the destination state node ($u_1 s_{1,1} s_{1,2} \ldots s_{1,v_1-1} u_2 s_{2,1} s_{2,2} \ldots s_{2,v_2-1}$). Each state node has four branches, each corresponding to one of four possible input values. Each trellis stage has total $2^{v+2}$ branches.

The Viterbi decoding method finds the sequence of branch words closest in distance to the received noisy sequence in the trellis diagram. To find global most-likely path, however, the Viterbi decoding method must compute the branch metric of $2^{v+2}$ branches in each decoding stage. The branch metric is the distance between the received symbol and the branch word. The hamming distance is applied for hard decision decoding method, while the Euclidean distance is applied for soft decision decoding method. Soft decision decoding method captures more information and consequently performs better than hard decision decoding method, but the soft decision decoding method has a higher computational complexity. The branch metrics accumulated along a path in the trellis diagram form a path metric. When four paths enter the same state, the path with the smallest path metric is selected as the surviving path. Once the traceback depth has been reached, the path with the smallest path metric is selected as the global most-likely path. Finally, the decoder performs a traceback procedure along the path that is most likely to generate the decoded output. Hence, the computational complexity of the Viterbi decoding method increases exponentially with constraint length v. Thus, the practical application of the Viterbi decoding method with a long constraint length is limited. Therefore, it is desirable to provide an improved method to mitigate and/or obviate the computational complexity problems of the Viterbi decoding method.

SUMMARY OF THE INVENTION

The object of the invention is to provide a method of Virterbi decoding with a reduced butterfly operation, which can dramatically reduce the complexity of the Viterbi decoding.

To achieve the object, there is provided a method of Virterbi decoding with a reduced butterfly operation, which exploits the branch symmetry of the trellis to reduce the branch metric computation. The method comprises the steps of: (A) receiving the encoded signal; (B) computing kernel branch metrics with the reduced butterfly operation in accordance with the encoded signal; (C) using symmetry property of the reduced butterfly operation to obtain branch metrics other than the kernel branch metrics; (D) computing path metrics for each node; (E) selecting a surviving path with the smallest path metric for each nodes.

Other objects, advantages, and novel features of the invention will become more apparent from the following detailed description when taken in conjunction with the accompanying drawings.

DETAILED DESCRIPTION OF THE PREFERRED EMBODIMENT

Figure 3:
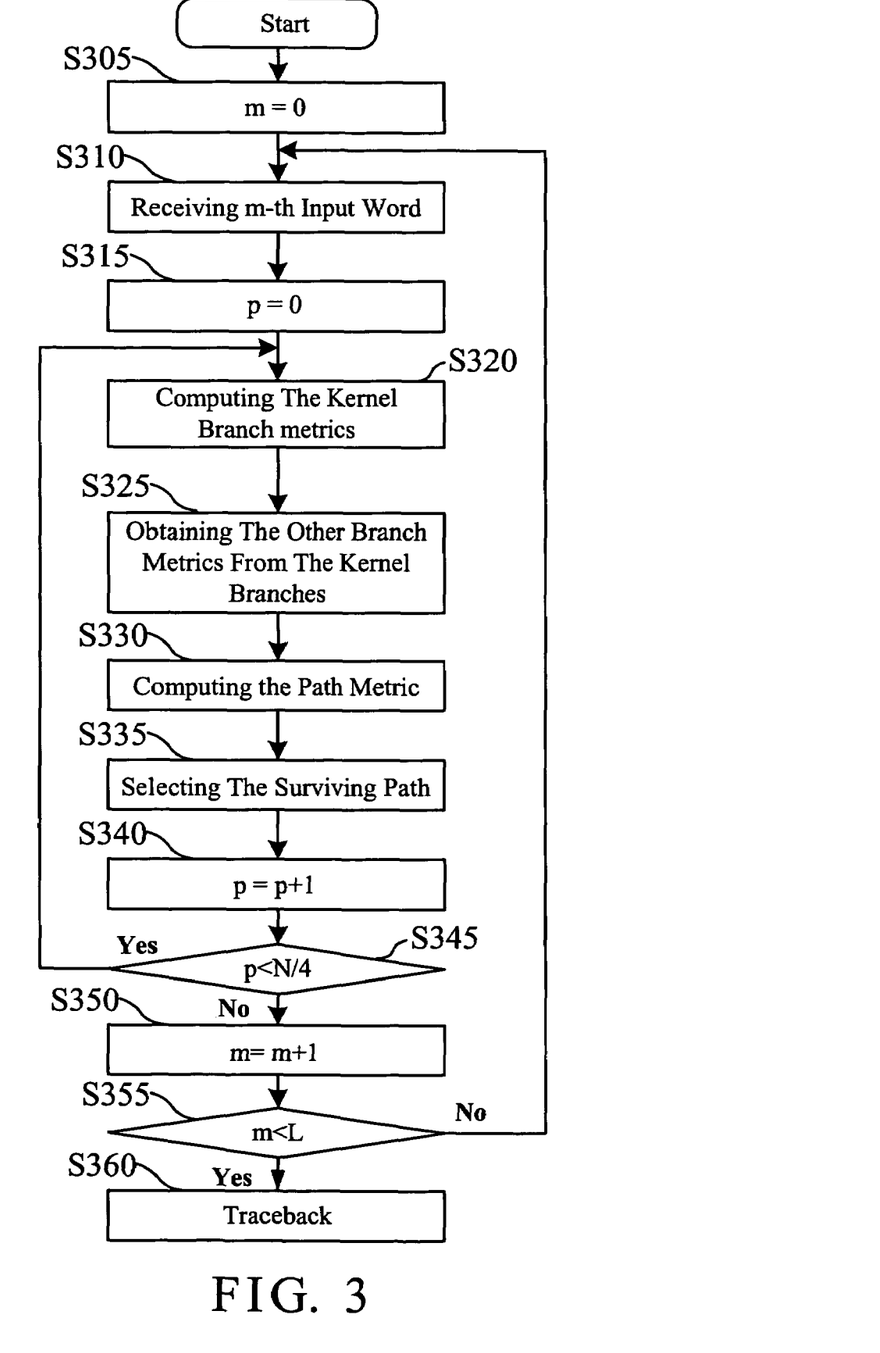
FIG. 3 is a flowchart of a Virterbi decoding with a reduced butterfly operation in accordance with the invention.

FIG. 3 is a flowchart of a Virterbi decoding with a reduced butterfly operation in accordance with the invention, which decodes an encoded signal to reconstruct a source data signal.

As shown in FIG. 3, first, step S305 is executed to initialize the index m. Step S310 receives a m-th input word of the encoded signal from a data link that can be a wireless communication channel, a wire communication channel, and so on. Step S315 initializes the index p for starting the m-th decoding stage. At each decoding stage, the trellis with $N=2^v$ state nodes are first decomposed into N/4 radix-4 butterfly.

Step S320 computes the kernel branch metrics within the p-th radix-4 butterfly in accordance with the m-th input word of the encoded signal. The reduced butterfly operation dramatically reduces the computation amount by using the branch symmetry that derives from two relationships found in the trellis branches. The first relationship exists in the branches emanating from the same origin state node. Since these branches have the same register contents except bits ($u_1$, $u_2$), their i-th bit $y_i$ in the equation (1) can be rewritten as:

$$y_i = g_{1,0}^i \cdot u_1 \oplus g_{2,0}^i \cdot u_2 \oplus X_1^i, \tag{3}$$

where their common term $X_1^i$ is denoted as:

$$X_1^i = g_{1,1}^i \cdot s_{1,1} \oplus \cdots g_{1,v_1}^i \cdot s_{1,v_1} \oplus \\ g_{2,1}^i \cdot s_{2,1} \oplus \cdots g_{2,v_2}^i \cdot s_{2,v_2}. \tag{4}$$

From equation (3), it shows that the relationship among the i-th bit $y_i$ of each branch emanating from the same state node depends on the ($g_{1,0}^i$, $g_{2,0}^i$).

The second relationship exists in branches emerging to the same destination state node. Since these branches have the same register contents except bits ($s_{1,v_1}$, $s_{2,v_2}$), their i-th bit $y_i$ in equation (1) can be rewritten as:

$$y_i = g_{1,v_1}^i \cdot s_{1,v_1} \oplus g_{2,v_2}^i \cdot s_{2,v_2} \oplus X_2^i, \tag{5}$$

where their common term $X_2^i$ is denoted as:

$$X_2^i = g_{1,0}^i \cdot u_1 \oplus g_{1,1}^i \cdot s_{1,1} \oplus \cdots g_{1,v_1-1}^i \cdot s_{1,v_1-1} \oplus \\ g_{2,0}^i \cdot u_2 \oplus g_{2,1}^i \cdot s_{2,1} \oplus \cdots g_{2,v_2-1}^i \cdot s_{2,v_2-1}. \tag{6}$$

From equation (5), it shows that the relationship among the bit $y_i$ of each branch emerging into the same state depends on ($g_{1,v_1}^i$, $g_{2,v_2}^i$).

The symmetry of trellis branches exploited in the present invention is derived from the two relationships. By exploiting the two relationships, 16 relevant branches in the trellis can be found, and the relationship among the i-th bit $y_i$ of each branch word can be determined by ($g_{1,0}^i$, $g_{1,v_1}^i$, $g_{2,0}^i$, $g_{2,v_2}^i$). Since the relationship only exists in i-th bit of a branch word, it can be regarded as bit symmetry of the i-th bit $y_i$. Then, the branch symmetry of the relevant branches is obtained from the intersection of bit symmetry of n output bits.

Figure 4:
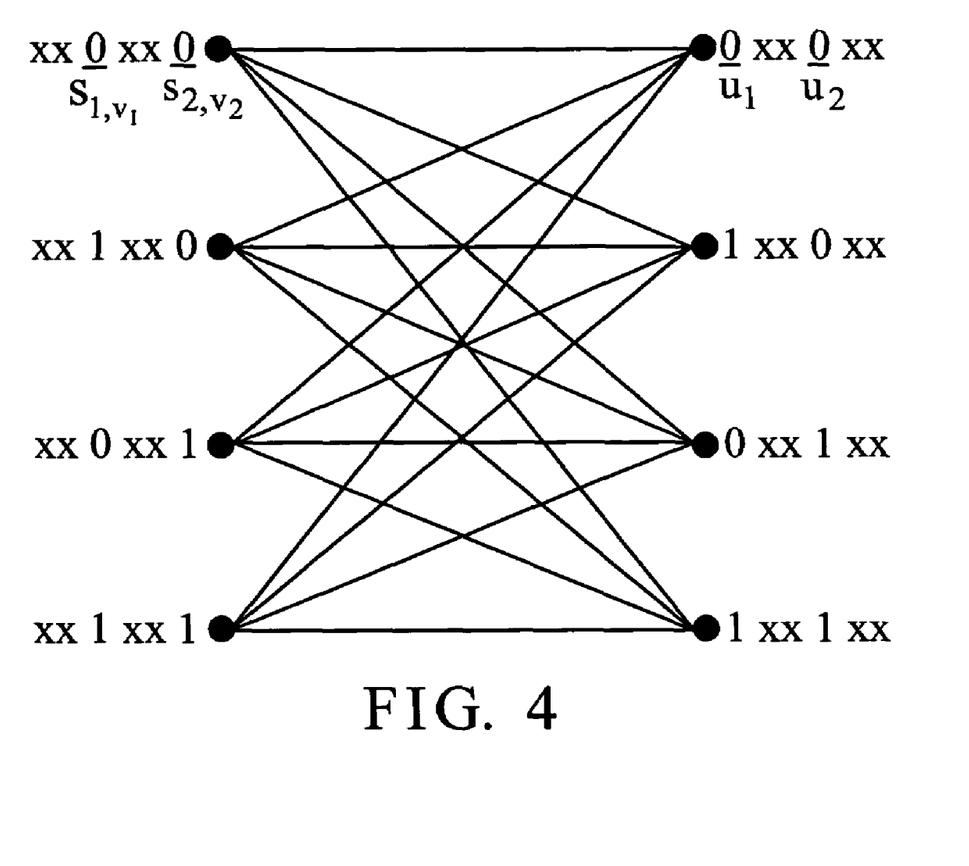
FIG. 4 is a schematic view of decomposing the trellis into $2^{v-2}$ radix-4 butterfly in accordance with the invention.

The two relationships described by the equations (3) and (5) can be used to find 16 relevant branches. In the present invention, a butterfly structure is proposed to group these branches and their associated states node. This can be achieved by decomposing the trellis into $2^{v-2}$ radix-4 butterfly as shown in FIG. 4 in the manner that all four origin and destination states in the same radix-4 butterfly own the same state bits($s_{1,1}, \ldots, s_{1,v_1-1}, s_{2,1}, \ldots, s_{2,v_2-1}$). As shown in FIG. 4, symbol xx is used to denote the same state bits. Then, the i-th bit $y_i$ of each branch word within the butterfly can be rewritten as:

$$y_i = g_{1,0}^i \cdot u_1 \oplus g_{1,v_1}^i \cdot s_{1,v_1} \oplus g_{2,0}^i \cdot u_2 \\ g_{2,v_2}^i \cdot s_{2,v_2} \oplus X^i, \tag{7}$$

where their common term $X^i$ is denoted as:

$$X^i = g_{1,1}^i \cdot s_{1,1} \oplus \cdots g_{1,v_1-1}^i \cdot s_{1,v_1-1} \oplus \\ g_{2,1}^i \cdot s_{2,1} \oplus \cdots g_{2,v_2-1}^i \cdot s_{2,v_2-1}.$$

Figure 5:
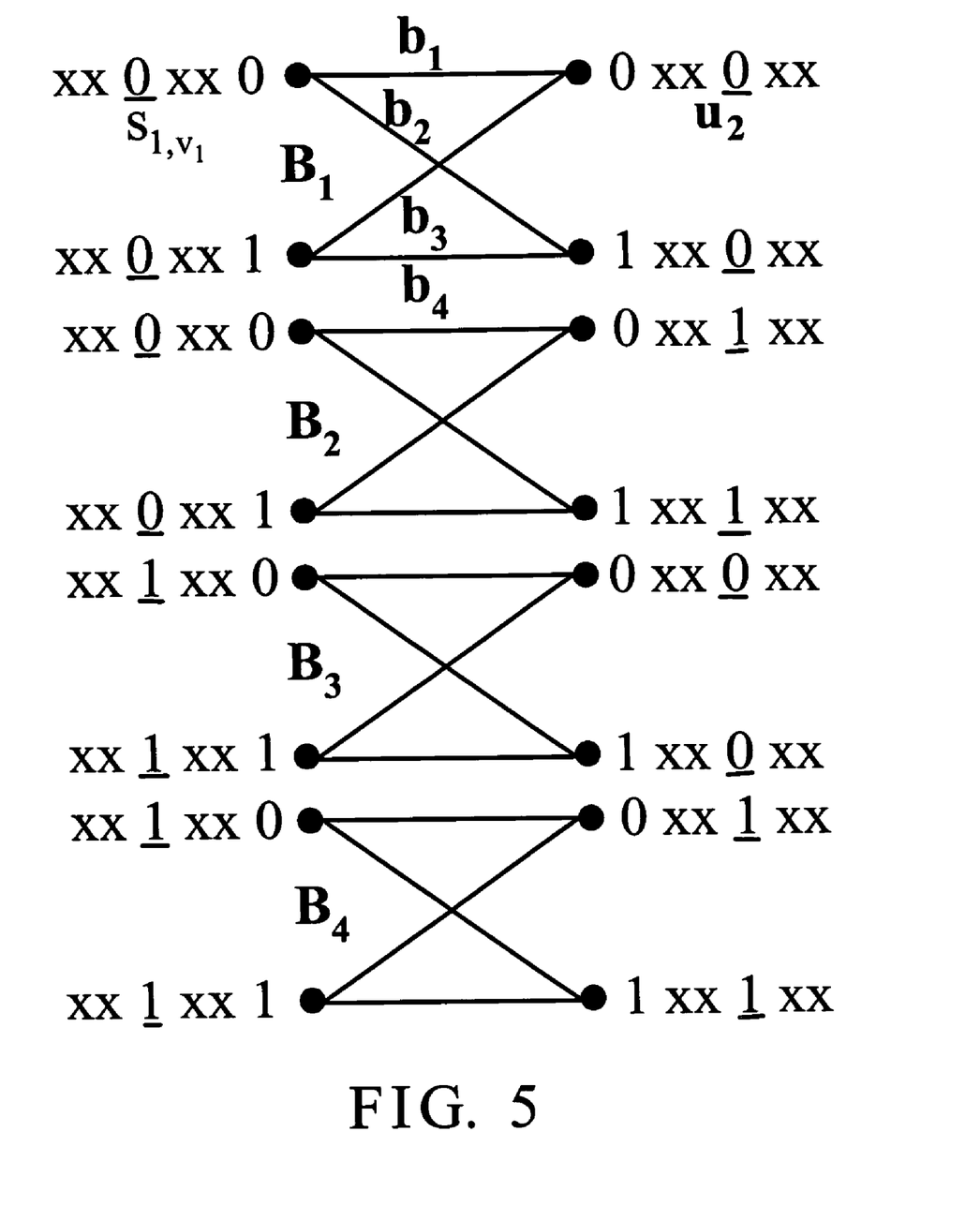
FIG. 5 is a schematic view of decomposing the radix-4 butterfly into four radix-2 butterflies $\{B_1, B_2, B_3, B_4\}$.

After grouping the relevant branches into the same radix-4 butterfly structure, the next step is to find the symmetry of the 16 relevant branches. Since $X^i$ does not affect the relationship among the sixteen relevant branches, the bit symmetry of the i-th bit of these sixteen branches is determined by elements ($g_{1,0}^i, g_{1,v_1}^i, g_{2,0}^i, g_{2,v_2}^i$) of generator sequences. Because that each element of generator sequence is either 1 or 0, there are 16 distinct kinds of bit symmetry. The branch symmetry is given by the intersection of n bit symmetries, so it cannot directly be obtained because of the influence of the generator sequences on bit symmetry. To reduce the influence of generator sequences on bit symmetry, the radix-4 butterfly is further decomposed into four radix-2 butterflies {$B_1, B_2, B_3, B_4$} as shown in FIG. 5. Each radix-2 butterfly structure has four state nodes and four branches. In the state node of each radix-2 butterfly structure, the only different bits left are $u_1$ and $s_{2,v_2}$. This means that the kind of bit symmetry within each radix-2 butterfly only depends on $g_{1,0}^i$ and $g_{2,v_2}^i$.

Additionally, the kind of symmetry among four radix-2 butterflies only depends on $g_{2,0}^i$ and $g_{1,v_1}^i$ because that the four butterflies own the same state contents except $u_2$ and $s_{1,v_1}$. The kinds of bit symmetry of the butterfly structure are summarized in Table 1. The symbol "'" is used to denote the complementary relationship. It shows that the symmetry in Table 1 only corresponds to the bit symmetry of the i-th bit. The branch symmetry of butterfly is obtained from the intersection of n bit symmetries.

TABLE 1

| The bit symmetry of the butterfly structure | | |
|---|---|---|
| $g_{1,0}^i$ | $g_{2,v2}^i$ | The symmetry within a radix-2 butterfly |
| 0 | 0 | $b_1 = b_2 = b_3 = b_4$ |
| 1 | 0 | $b_1 = b_2' = b_3 = b_4'$ |
| 0 | 1 | $b_1 = b_2 = b_3' = b_4'$ |
| 1 | 1 | $b_1 = b_2' = b_3' = b_4'$ |
| $g_{2,0}^i$ | $g_{1,v1}^i$ | The symmetry among radix-2 butterflies |
| 0 | 0 | $B_1 = B_2 = B_3 = B_4$ |
| 1 | 0 | $B_1 = B_2' = B_3 = B_4'$ |
| 0 | 1 | $B_1 = B_2 = B_3' = B_4'$ |
| 1 | 1 | $B_1 = B_2' = B_3' = B_4$ |

As shown in Table 1, each bit of a branch word can provide 1/16 bit symmetry by applying the butterfly structure to the decoder. In the present invention, 1/x symmetry means that the metric branch computation can be reduced by a factor of x. Considering ¼ symmetry code for example, only one of four branch metrics needs to be computed, and then the other three branch metric can be derived from the computed branch. After intersecting the bit symmetries, there are four kinds of branch symmetry (½, ¼, ⅛, and 1/16 symmetry) may exist in the butterfly structure. While all output bits of a code have the same bit symmetry, the code can have 1/16 branch symmetry.

In Table 2, the generator sequences are represented in right-justified octal notation. By using the butterfly structure, their branch metric computation can be reduced by a factor of 2 or 4, thus significantly reducing the computational complexity of the Viterbi decoder.

TABLE 2

The well known codes of rate 2/3 with symmetry

| v | Generator sequences | Branch symmetry |
|---|---|---|
| 2 | 3 1 3 | 1/2 |
|   | 1 2 2 | |
| 3 | 2 1 3 | 1/4 |
|   | 1 4 7 | |
| 5 | 06 03 07 | 1/4 |
|   | 03 10 17 | |
| 7 | 14 07 13 | 1/2 |
|   | 07 23 36 | |
| 8 | 32 05 25 | 1/2 |
|   | 13 33 22 | |
| 9 | 25 03 36 | 1/2 |
|   | 05 70 53 | |

Figure 6:
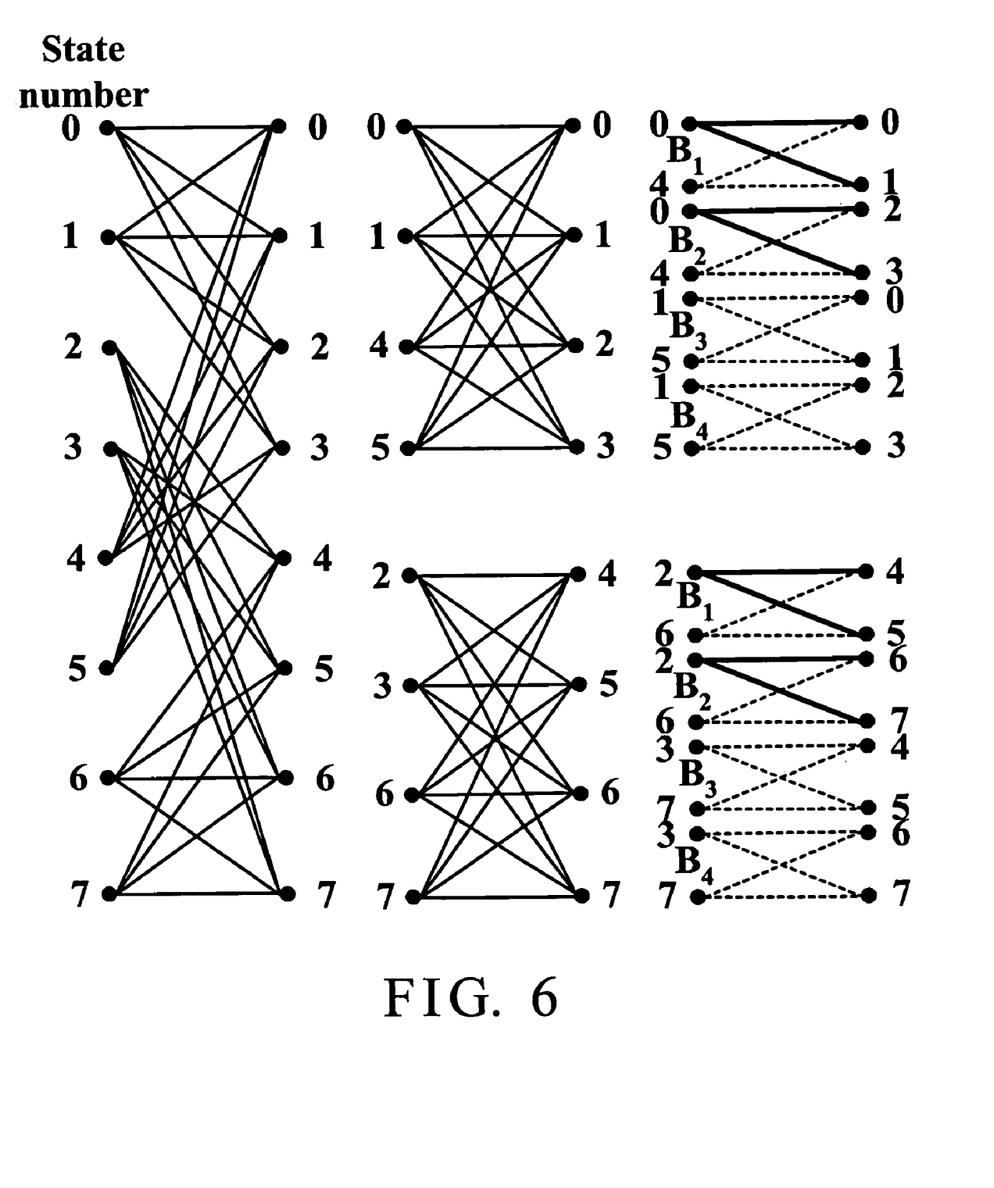
FIG. 6 is a schematic view of the invented butterfly structure for a best known code of a constraint length v=3.

For example, FIG. 6 shows a schematic view of the invented butterfly structure for a best known code of a constraint length v=3 in Table 2. As shown it illustrates how the invented butterfly structure works to reduce the branch metric computation. Its generator sequences in binary format are given as follows:

$$g_1^1=[10], g_1^2=[01], g_1^3=[11],$$

$$g_2^1=[001], g_2^2=[100], g_2^3=[111].$$

From table 1, the bit symmetry within a butterfly can be respectively written as follows:

$$\text{bit } y_1 \; (g_{1,0}^1=1, g_{2,2}^1=1): b_1=b'_2=b'_3=b_4$$

$$\text{bit } y_2 \; (g_{1,0}^2=0, g_{2,2}^2=0): b_1=b_2=b_3=b_4$$

$$\text{bit } y_3 \; (g_{1,0}^3=1, g_{2,2}^3=1): b_1=b'_2=b'_3=b_4$$

The branch symmetry within a radix-2 butterfly, i.e. $b_1=b_4$ and $b_2=b_3$, can be obtained from the three bit symmetries. Similarly, the bit symmetry among four radix-2 butterflies can be respectively written as follows:

$$\text{bit } y_1 \; (g_{2,0}^1=0, g_{1,1}^1=0): B_1=B_2=B_3=B_4$$

$$\text{bit } y_2 \; (g_{2,0}^2=1, g_{1,1}^2=1): B_1=B'_2=B'_3=B_4$$

$$\text{bit } y_3 \; (g_{2,0}^3=1, g_{1,1}^3=1): B_1=B'_2=B'_3=B_4$$

Then, the branch symmetry among butterflies is $B_1=B_4$ and $B_2=B_3$.

After obtaining the branch symmetry of the butterfly from the generator sequences, the next step is to decompose the trellis into the invented butterflies. As shown in FIG. 6, the trellis is first decomposed into $2^{v-2}=2$ radix-4 butterflies in accordance with the manner in FIG. 4, where each radix-4 butterfly owns the same symmetry of butterfly. In FIG. 6, the state number is defined as the bit-reversed representation of state. Then, each radix-4 butterfly is further decomposed into four radix-2 butterflies in accordance with the manner in FIG. 5. According to the branch symmetry of butterfly structure obtained above, only the kernel branch metrics of four branches in each radix-4 butterfly, shown as solid line in FIG. 6, need to be computed, and the branch metrics of the other 12 branches shown as dotted lines can be derived from the computed branches. Thus, the branch metric computation of the example code can be reduced by a factor of 4.

Step S325 uses the symmetry property of the butterfly structure to obtain the other branch metrics from the kernel branch metrics. Step S330 computes path metrics based on the branch metrics and the kernel branch metric for each state node. For all of the destination state nodes, their branch metrics are added to the corresponding previous path metrics. Step S335 selects a surviving path with the smallest path metric from the state nodes. Step S345 determines whether the branch metrics of all the state nodes at p-th stage are computed completely or not. If yes, the process goes to step S350, otherwise, the process goes to step S320.

Step S355 determines whether the surviving path reaches a traceback depth or not. If the surviving path reaches the traceback depth, then the process goes to step S360, otherwise, the process goes to step S310. Step S360 performs a traceback procedure from the surviving path to decide the source data signal bits. After the surviving path reaches the traceback depth, the traceback procedure will be started to compute the most likely decoded bits from the surviving path. Usually, it is sufficient to set the traceback depth as 5×v.

In view of the foregoing, it is known that the invention uses reduced butterfly operation in the trellis diagram to avoid the prior problems of requiring large computation for Viterbi decoding. The invention not only dramatically reduces the computation for calculating the branch metrics, but also increases the decoding speed in the Viterbi decoding.

Although the present invention has been explained in relation to its preferred embodiment, it is to be understood that many other possible modifications and variations can be made without departing from the spirit and scope of the invention as hereinafter claimed.

What is claimed is:

1. A method of Viterbi decoding implemented in a communication system with a reduced butterfly operation, which decodes an encoded signal to reconstruct a source data signal and uses a trellis diagram with a plurality of nodes, wherein each node of the trellis has four branches associated therewith, the method comprising the steps of:

(A) receiving the encoded signal;
    (B) computing kernel branch metrics with the reduced butterfly operation in accordance with the encoded signal, wherein the reduced butterfly operation is a radix-4 butterfly operation based on symmetry property of the trellis, and the symmetry property of the trellis exists in the branches emanating from the same origin state node and the symmetry property of the trellis can be determined by a generator sequence;
    (C) using symmetry property of the reduced butterfly operation to obtain branch metrics other than the kernel branch metrics;
    (D) computing path metrics for each node ; and
    (E) selecting a surviving path with the smallest path metric for each nodes.

2. The method as claimed in claim 1, wherein the steps (B) to (E) are repeated until the surviving path reaches a traceback depth.

3. The method as claimed in claim 2, further comprising the steps of:

(F) performing a traceback procedure from the surviving path to decide the source data signal bits.

4. The method as claimed in claim 3, wherein the reduced butterfly operation reduces the computation amount by using the branch symmetry that derives from two relationships found in the trellis branches, the first relationship exists in the branches emanating from the same origin state node and as these branches have the same register contents except bits (u1, u2), their i-th bit yi can be rewritten as:

$$y_i = g_{1,0}^i \cdot u_1 \oplus g_{2,0}^i \cdot u_2 \oplus X_1^i,$$

where $X_1^i$ is denoted as:

$$X_1^i = g_{1,1}^i \cdot s_{1,1} \oplus \cdots g_{1,v_1}^i \cdot s_{1,v_1} \oplus \\ g_{2,1}^i \cdot s_{2,1} \oplus \cdots g_{2,v_2}^i \cdot s_{2,v_2},$$

and where and $u_1$ and $u_2$ are two input bits of the encoded signal, $y_i$ is a i-th output bit of the source data signal, $g_j^i$ 32 $[g_{j,0}^i, g_{j,1}^i, \ldots, g_{j,v_j}^i]$ is a generator sequence of the i-th output bit $y_i$ of the source data signal with respect to the j-th input bit $u_j$ of the encoded signal, $v_1$ and $v_2$ are constrain length of two shift operation, $S_{1,1} \ldots, S_{1,v_1}, S_{2,1} \ldots, S_{2,v_2}$ are the contents of the shift operation; the relationship among the bit yi of each branch emanating from the same origin state depends on $(g_{1,0}^i, g_{2,0}^i)$ ; the second relationship exists in branches emerging to the same destination state node and these branches have the same register contents except bits ($S_{1,v_1}$, $S_{2,v_2}$), their i-th bit yi can be rewritten as:

$$y_i = g_{1,v_1}^i \cdot S_{1,v_1} \oplus g_{2,v_2}^i \cdot S_{2,v_2} \oplus X_2^i,$$

where their common term $X_2^i$ is denoted as:

$$X_2^i = g_{1,0}^i \cdot u_1 \oplus g_{1,1}^i \cdot s_{1,1} \oplus \cdots g_{1,v_1-1}^i \cdot s_{1,v_1-1} \oplus \\ g_{2,0}^i \cdot u_2 \oplus g_{2,1}^i \cdot s_{2,1} \oplus \cdots g_{2,v_2-1}^i \cdot s_{2,v_2-1},$$

and the relationship among the bit yi of each branch emerging into the same state depends on $(g_{1,v_1}^i, g_{2,v_2}^i)$; the symmetry of trellis branches is derived from the two relationships, by exploiting the two relationships, 16 relevant branches in the trellis can be found, and the relationship among the i-th bit vi of each branch word can be determined by $(g_{1,0}^i, g_{1,v_1}^i, g_{2,0}^i, g_{2,v_2}^i)$.

5. The method as claimed in claim 3, wherein the traceback depth is 5v, where v is an overall constraint length and defined as $v=v_1+v_2$.

* * * * *